US012751218B2

(12) United States Patent
Zhao et al.

(10) Patent No.: US 12,751,218 B2
(45) Date of Patent: Sep. 29, 2026

(54) DIODE DEVICE WITH PROGRAMMABLE CONDUCTING CURRENT AND ARRAY PREPARATION METHOD THEREOF

(71) Applicant: ZHEJIANG UNIVERSITY, Hangzhou (CN)

(72) Inventors: Yi Zhao, Hangzhou (CN); Xiang Ding, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 435 days.

(21) Appl. No.: 18/457,326

(22) Filed: Aug. 28, 2023

(65) Prior Publication Data

US 2024/0032446 A1 Jan. 25, 2024

Related U.S. Application Data

(63) Continuation of application No. PCT/CN2022/110250, filed on Aug. 4, 2022.

(30) Foreign Application Priority Data

May 8, 2022 (CN) ........................ 202210495945.X

(51) Int. Cl.
*H10N 70/00* (2023.01)
*H10B 63/00* (2023.01)
*H10N 70/20* (2023.01)

(52) U.S. Cl.
CPC ........... *H10N 70/841* (2023.02); *H10B 63/84* (2023.02); *H10N 70/011* (2023.02); *H10N 70/24* (2023.02); *H10N 70/8833* (2023.02)

(58) Field of Classification Search
CPC .. H10N 70/841; H10N 70/8833; H10N 63/84; H10N 70/24; H10N 70/011
See application file for complete search history.

(56) References Cited

U.S. PATENT DOCUMENTS

2012/0069632 A1* 3/2012 Hayakawa ............. H10B 63/20 257/E47.001
2013/0329485 A1* 12/2013 Takashima ......... G11C 13/0064 365/148
2014/0138608 A1* 5/2014 Sills ..................... H10N 70/245 257/4

FOREIGN PATENT DOCUMENTS

CN 102969328 A 3/2013
CN 103106926 A 5/2013
(Continued)

OTHER PUBLICATIONS

International Search Report (PCT/CN2022/110250); Date of Mailing: Jan. 18, 2023.
(Continued)

*Primary Examiner* — Robert J Michaud
(74) *Attorney, Agent, or Firm* — Wiersch Law Group

(57) ABSTRACT

The present disclosure discloses a diode device with programmable conducting current, which comprises a metal structure, a resistance variable structure and a semiconductor structure. The present disclosure has an ultra-high self-rectification ratio and stable unipolar resistance change characteristics. A state density function of the semiconductor needs to include at least one peak, which is located near the forbidden band, and a Schottky barrier can be formed at its interface to make the device behave as a diode, thus effectively suppressing the interference of bypass leakage current in the array. The resistance variable structure has unidirectional resistance variable ability, and can perform erasing operation in the direction of current conduction, which on the one hand avoids the problem that the erasing operation cannot be performed by reverse voltage, on the other hand avoids applying reverse voltage to the barrier and improves the reliability of self-rectification effect.

8 Claims, 9 Drawing Sheets

(56) References Cited

FOREIGN PATENT DOCUMENTS

| | | | |
|---|---|---|---|
| CN | 103227283 | A | 7/2013 |
| CN | 103403807 | A | 11/2013 |

OTHER PUBLICATIONS

A-Self-Rectifying-Unipolar-HfOx-Based-RRAM-Using-Doped-Germanium-Bottom-Electrode.

ZrTiOx-Based-Resistive-Memory-With-MIS-Structure-Formed-on-Ge-Layer.

* cited by examiner

Erasure interference characteristic

Reliability of self-rectification ratio

DIODE DEVICE WITH PROGRAMMABLE CONDUCTING CURRENT AND ARRAY PREPARATION METHOD THEREOF

CROSS-REFERENCE TO RELATED APPLICATIONS

The present application is a continuation of International Application No. PCT/CN2022/110250, filed on Aug. 4, 2022, which claims priority to Chinese Application No. 202210495945.X, filed on May 8, 2022, the contents of both of which are incorporated herein by reference in their entireties.

TECHNICAL FIELD

The present disclosure belongs to the field of semiconductors and integrated circuits, and in particular relates to a diode device with programmable conducting current which is based on a semiconductor structure and can be applied to a large-scale memory array. The introduction of the semiconductor allows it to have good compatibility with Complementary Metal-Oxide-Semiconductor Transistor (CMOS) technology, and at the same time, the simple structure of the device facilitates 3D integration.

BACKGROUND

A resistance random access memory (RRAM) usually has a sandwich structure of metal—a resistance variable layer-metal, and stores information by changing the resistance of the resistance variable material between the upper and lower metal electrodes. Compared with the traditional embedded flash memory technology, this kind of memory has excellent storage performance such as low operating voltage, high switching ratio, low power consumption, good durability and retention characteristics, and has a good scaling advantage.

There is a serious problem of read interference in RRAM integration, and it is necessary to add gating tubes to suppress the interference of bypass leakage current. The common array structures are 1D1R and 1T1R, which are composed of diodes or transistors and resistance variable elements. Although this structure can solve the crosstalk problem between devices, it increases the device area and weakens the integration level. On the other hand, considering the compatibility with CMOS technology, the commonly used RRAM bottom electrode technology generally uses noble metal Pt, which is difficult to etch and has weak adhesion, which makes its compatibility with CMOS technology more complicated. The present disclosure provides a solution to the above three problems of read interference, integration and CMOS compatibility.

SUMMARY

In view of the interference of bypass current in the RRAM array, the weakening of integration and the lack of compatibility of CMOS process, the present disclosure provides a diode device with programmable conducting current based on a semiconductor structure, which uses Schottky contact between a semiconductor structure and an oxygen vacancy conduction channel in a resistance variable structure to suppress bypass current, which is completely compatible with the CMOS process and facilitates 3D integration.

The present disclosure is realized by the following technical solutions.

The present disclosure provides a diode device with programmable conducting current. The device includes a metal structure, a resistance variable structure and a semiconductor structure; a resistance of the resistance variable structure can be adjusted, so as to achieve programmable conducting current; the semiconductor structure is composed of a semiconductor, and a state density function of the semiconductor contains at least one peak, so that a state density near an energy level of a peak is much greater than that of an energy level of the semiconductor structure except the peak; the metal structure, the resistance variable structure and the semiconductor structure are directly connected in turn.

Further, the metal structure is composed of one or more metals, including but not limited to TiN, Ni, W, Ti, Al, Pd, Pt, Au and Ru.

Further, the resistance variable structure is a unipolar resistance variable oxide layer, which consists of one or more oxides, including but not limited to $TiO_2$, NiO, $Ni_2O_3$, $Y_2O_3$, $HfO_2$, $WO_3$, $ZrO_2$ and $Ta_2O_5$.

Further, by adjusting a voltage and a current limit applied to the metal structure, the resistance variable structure can be switched from a low-resistance state to a high-resistance state or from a high-resistance state in a current conducting direction.

Further, for the non-operated device, by applying a higher positive voltage, metallic conductive filament (CF) is formed in the resistance variable structure, and the device becomes a low resistance state (LRS), which is called forming; for devices in LRS, the CF is disconnected at the interface between resistance variable structure and the metal structure by applying a small positive voltage, and the device returns to a high resistance state (HRS), which is called Reset; for the device in HRS, the disconnected part of the CF is reconnected by applying a larger positive voltage, and the device returns to the low resistance state (LRS), which is called Set.

Further, a semiconductor material of the semiconductor structure includes but not limited to Ge, SiGe, GaAs, GaN, SiC, $Ga_2O_3$, and a position where the state density function comprises at least one peak is near a forbidden band.

Further, metallic oxygen vacancy conductive filaments (CFs) locally existing in the resistance variable structure can be directly connected with the semiconductor structure to form a Schottky contact, and the device behaves as a self-rectifying resistive random access memory and has the advantages of high CMOS compatibility and high array integration.

Further, when the semiconductor material of the semiconductor structure is a semiconductor (e.g., a Ge material) that is capable of pinning a Fermi level of a metal directly connected therewith to the vicinity of a valence band of the semiconductor without being affected by a work function of the metal itself, a size of a Schottky barrier at a surface of the semiconductor mainly depends on the properties of the semiconductor itself, so that the selection range of oxide species in the resistance variable structure and metal species in the metal structure is wider.

Furthermore, due to the existence of a Schottky barrier, the reverse current of the resistance variable structure is extremely small whether it is in HRS or LRS, and the rectification ratio of the forward and reverse voltages with the same value can be as high as $10^5$ or more, which can effectively suppress the bypass current and is suitable for large-scale array integration.

Furthermore, the reverse leakage current density of the Schottky barrier is generally constant, and its reverse leakage current is related to the device area and the density of the CF, while the low resistance current of the resistance variable structure mainly comes from the conduction of the CF and is insensitive to the change of device area, so the rectification ratio can be adjusted by adjusting the device area and the density of the CF.

Furthermore, the unipolar resistance variable oxide layer enables the device to realize Set and Reset operations when the current is on. On the one hand, it avoids the problem that the operation cannot be carried out by the reverse voltage because the reverse current is suppressed; on the other hand, it avoids the degradation of the Schottky junction caused by the application of the reverse voltage, and improves the reliability of the Schottky junction.

The present disclosure further provides a method for preparing a memory array constructed based on the above diode device with programmable conducting current. The method includes the following steps:

Preparation Solution 1:

S11, forming strip-shaped n-type semiconductors arranged at intervals as bit lines on a p-type semiconductor substrate by ion implantation or spin coating doping, growing an isolation layer, and etching the isolation layer to form grooves arranged at intervals.

A range of the grooves is within the bit lines;

S12, growing a resistance variable structure on the structure obtained in the step S11;

S13, growing a metal structure on the structure obtained in the step S12, and etching the metal structure to form word lines arranged at intervals; and S14, growing metal at a same end of each bit line on the structure obtained in the step S13 to form contact electrodes of the bit lines;

Preparation Solution 2:

S21, growing an n-type semiconductor on an insulating layer, and etching the n-type semiconductor to form strip regions arranged at intervals as bit lines;

S22, growing a resistance variable structure on the structure obtained in the step S21;

S23, growing a metal structure on the structure obtained in the step S22, and etching the metal structure to form word lines arranged at intervals; and S24, growing metal at a same end of each bit line on the structure obtained in the step S23 to form contact electrodes of the bit lines.

The present disclosure further provides a method for preparing a 3D memory array constructed based on the diode device with programmable conducting current. Taking Ge as an example, the method includes the following steps:

S31, growing a stress buffer layer (Ge SRB) of Ge on a semiconductor silicon substrate, and then cyclically growing SiGe and heavily-doped Ge (with a doping concentration greater than $10^{18}$ $cm^{-3}$) in turn; in this step, a top layer is SiGe; the heavily-doped Ge is taken as a bit line; a number of cycles is greater than or equal to 2; the following is an example of three cycles: growing a stress buffer layer of Ge on a semiconductor silicon substrate, and then growing SiGe/Ge/SiGe/Ge/SiGe/Ge/SiGe in turn.

S32, selectively etching SiGe on the structure obtained in the step S31 and filling in an isolation layer; in this step, $SiO_2$ may be adopted for the isolation layer;

S33, selectively etching the heavily-doped Ge and filling lightly-doped Ge (with a doping concentration less than $10^{18}$ $cm^{-3}$) on the structure obtained in the step S32;

S34, growing a resistance variable structure and a protective layer on the structure obtained in the step S33; in this step, SiN can be adopted for the protective layer;

S35, selectively etching the protective layer in an device area on the structure obtained in the step S34, and growing a metal structure to form a word line; growing metal at a same end of each bit line to form a contact electrode of the bit line.

Further, a bit line region directly connected with the contact electrode of the bit line is a heavily-doped semiconductor, so that tunneling current dominates, thus ensuring ohmic contact, and at this time, the contact electrode is a common metal.

Alternatively, the contact electrode of the bit line is a metal (including but not limited to metals with low number of free electrons such as bismuth) that can form ohmic contact with the semiconductor structure, and the bit line region directly connected with the contact electrode does not need to be a heavily-doped semiconductor.

Furthermore, the device structure described in this present disclosure can be realized based on semiconductor Ge, which is considered as one of the most promising transistor substrate materials at present because of its electron and hole mobility much higher than that of Si. At present, CMOS applications based on Ge have attracted much attention from the industry, and achieving excellent memory performance on Ge has great application prospects.

The present disclosure has the advantages that: firstly, the present disclosure achieves an ultra-high self-rectification ratio and can be applied to large-scale array integration; secondly, the present disclosure does not need an external diode, utilizes the rectification characteristics of the semiconductor itself, has a simple structure and can facilitate 3D integration; thirdly, the conducting current of the present disclosure is small, and the operating voltage is lower than 5V, thus greatly reducing the power consumption; fourthly, the present disclosure can be directly prepared on a semiconductor, is completely compatible with advanced CMOS technology, and is suitable for rapidly developing semiconductor integrated circuits. To sum up, the present disclosure has the advantages of simple preparation process, low preparation cost, high integration, low operating voltage, low power consumption, robust disturbance immunity, three-dimensional integration and high CMOS compatibility.

DESCRIPTION OF EMBODIMENTS

The technical solution of the present disclosure will be described in detail with the attached drawings and specific embodiments. It is intended to provide a basic understanding of the present disclosure and is not intended to identify key or critical elements of the present disclosure or the scope to be protected. It is easy to understand that various substitutions, changes and modifications are possible for those skilled in the art without changing the true spirit of the present disclosure and without departing from the spirit and scope of the present disclosure and the appended claims. Therefore, the following detailed description and drawings are only exemplary explanations of the technical solution of the present disclosure, and shall not be regarded as the whole of the present disclosure or as limitations or definitions on the technical solution of the present disclosure.

Figure 1:
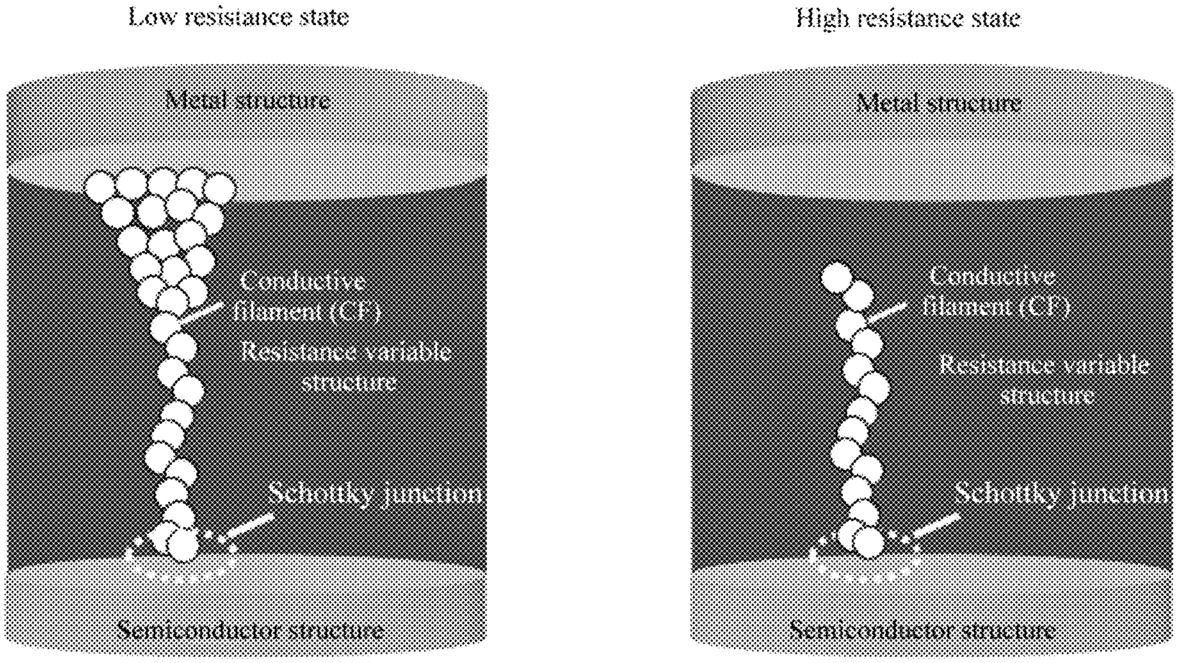
FIG. 1 is a schematic structural diagram of a diode device with programmable conducting current in HRS and LRS according to the present disclosure.

FIG. 1 is a schematic structural diagram of a diode device with programmable conducting current in HRS and LRS. The diode device with programmable conducting current provided by the present disclosure includes a metal structure, a resistance variable structure and a semiconductor structure. The resistance of the resistance variable structure can be adjusted, and the conducting current can be programmed. The semiconductor structure is composed of a semiconductor, and the state density function of the semiconductor contains at least one peak, so that the state density near the energy level of a peak is much larger than that of the energy level of the semiconductor structure except the peak; the metal structure, the resistance variable structure and the semiconductor structure are directly connected in turn. The CF in resistance variable structure and semiconductor structure form a Schottky junction.

Figure 2:
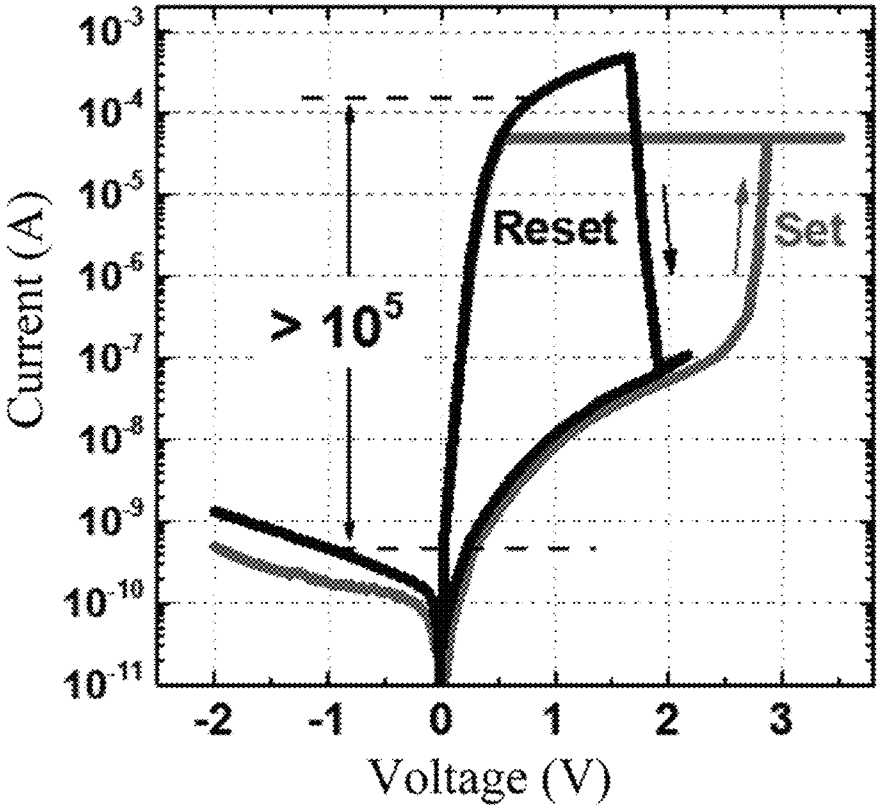
FIG. 2 is a current-voltage characteristic diagram of the diode device with programmable conducting current according to the present disclosure.
Figure 3A:
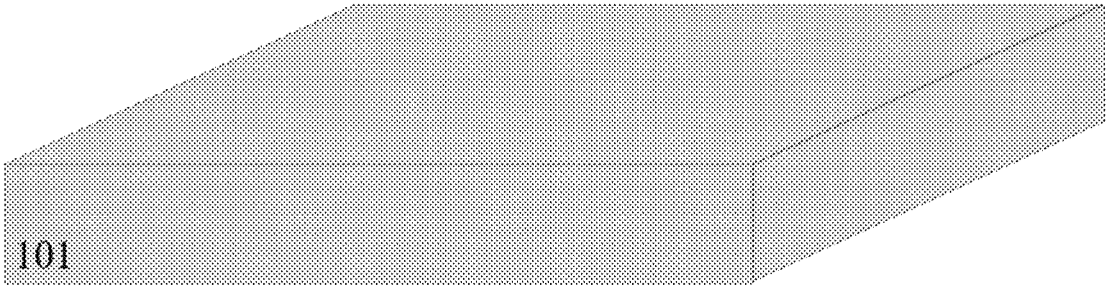
FIGS. 3(A), 3(B), 3(C), 3(D), 3(E) and 3(F) show how to prepare an array based on germanium (Ge) according to the present disclosure.
Figure 3B:
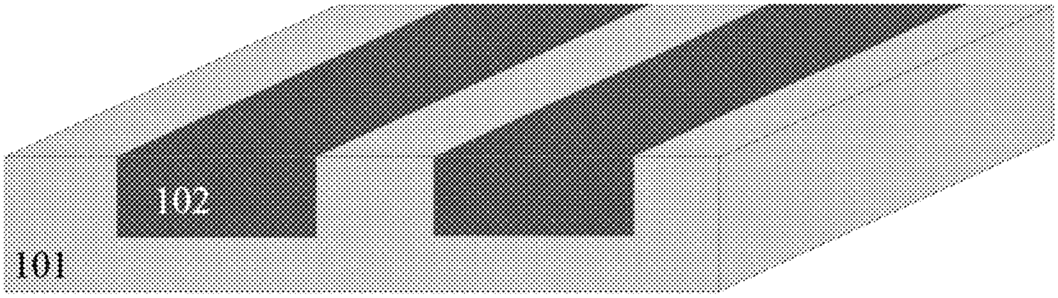
Figure 3C:
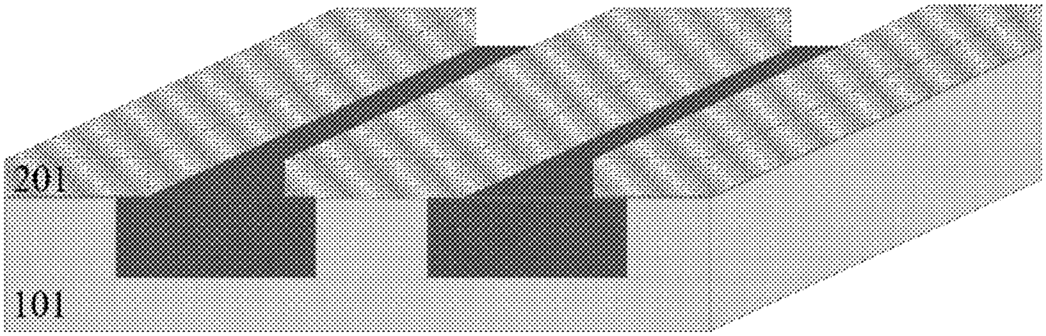
Figure 3D:
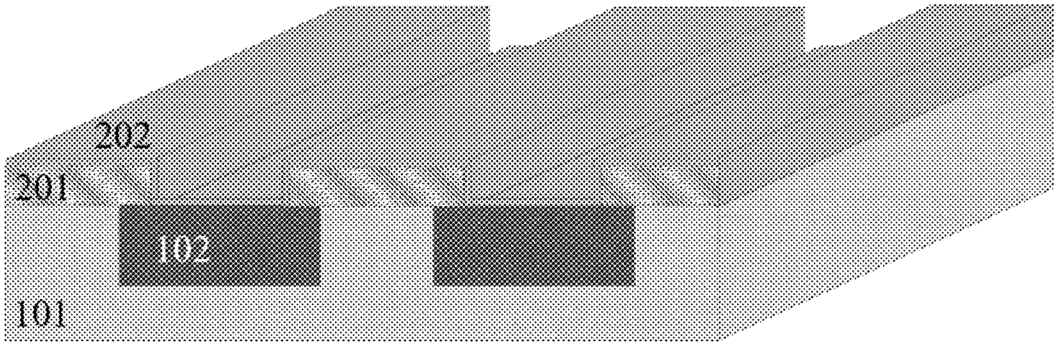
Figure 3E:
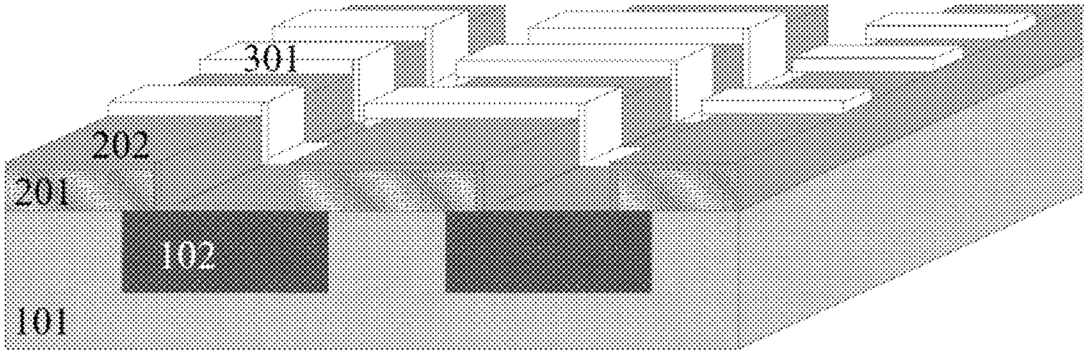
Figure 3F:
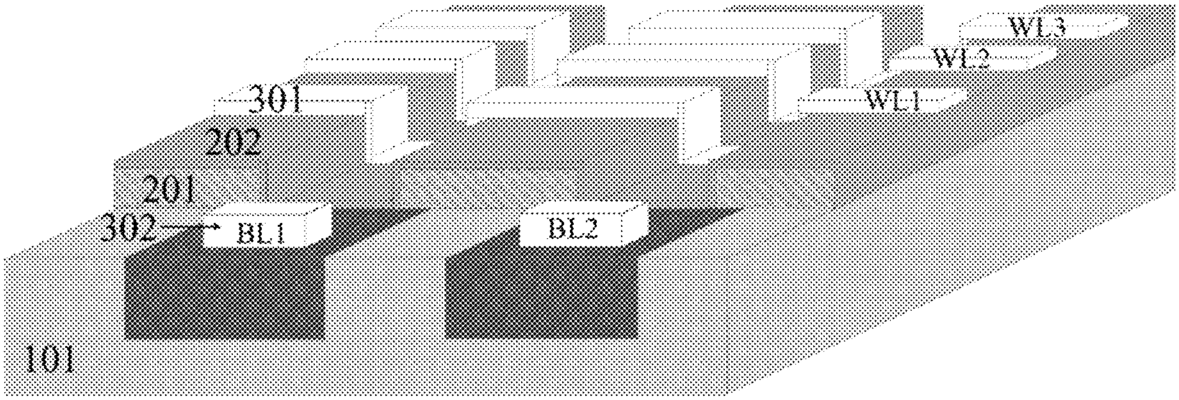
Figure 4A:
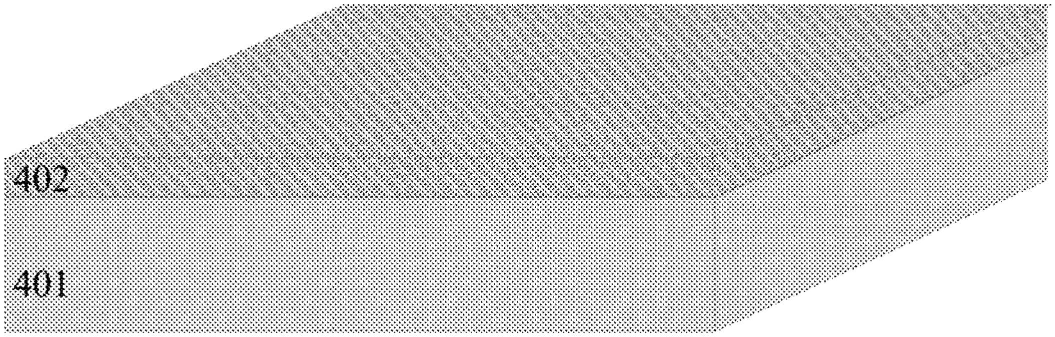
FIGS. 4(A), 4(B), 4(C), 4(D) and 4(E) show how to prepare an array based on an germanium on insulator (GOI) according to the present disclosure.
Figure 4B:
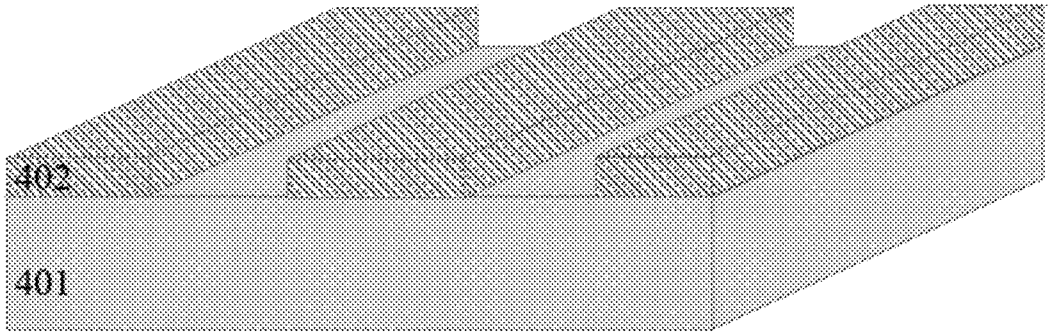
Figure 4C:
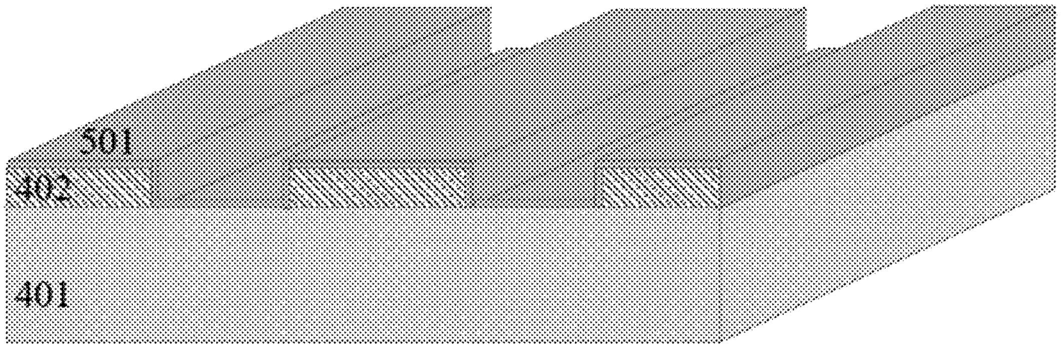
Figure 4D:
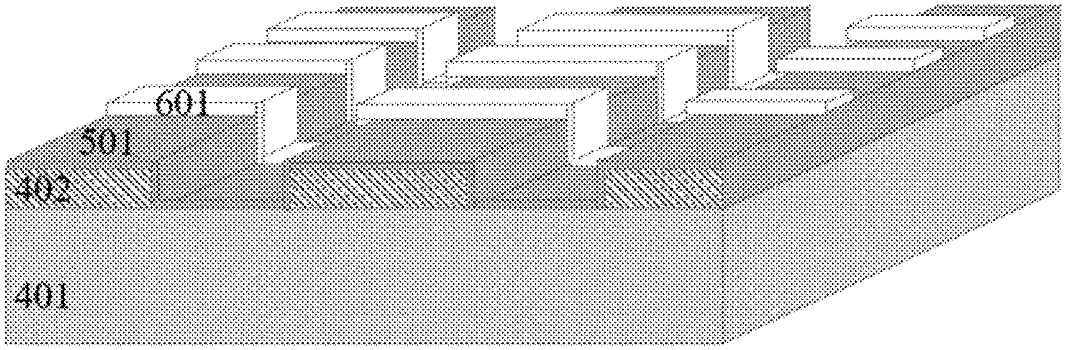
Figure 4E:
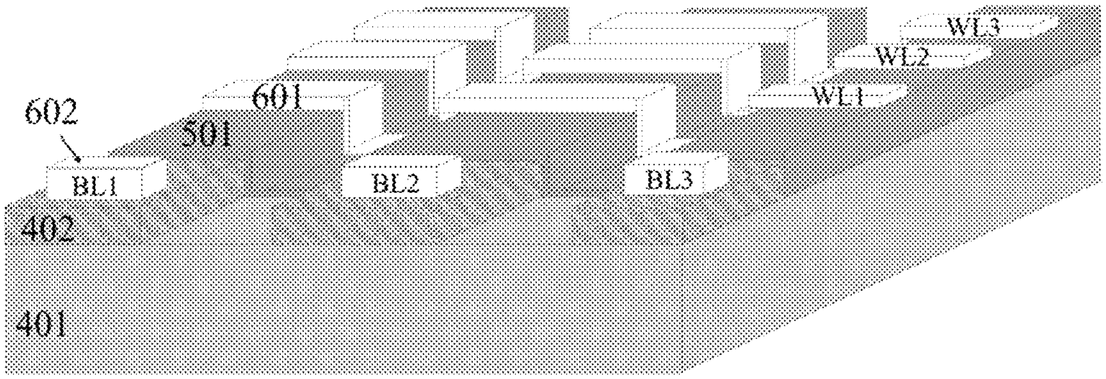

FIG. 2 is a current-voltage characteristic diagram of the diode device with programmable conducting current in the present disclosure. Specifically, when the resistance variable structure in LRS applies a small positive voltage to the metal structure and the current is not limited, the CF is disconnected at the interface between the resistance variable structure and the metal structure to turn the resistance variable structure into HRS; when a large positive voltage is applied to the resistance variable structure in FIRS and the current is limited, the CF reconnects to turn the resistance variable structure into LRS. Because of the barrier between the semiconductor structure and CF, the reverse current of the device in FIRS and LRS is extremely low.

Self-rectification ratio is defined as the ratio of forward current to reverse current when reading voltages with the same amplitude and opposite polarity are applied to the device in LRS. In this embodiment, when the read voltage is 0.8 V, the self-rectification ratio is greater than $10^5$, which greatly suppresses the bypass current. As mentioned above, if the device area is further reduced, the self-rectification ratio can be further improved. The device area and the self-rectification ratio are not limited by this embodiment.

Further, the metal structure is composed of one or more metals, including but not limited to TiN, Ni, W, Ti, Al, Pd, Pt, Au and Ru. The resistance variable structure is a unipolar resistance variable oxide layer, which consists of one or more oxides, including but not limited to $TiO_2$, NiO, $Ni_2O_3$, $Y_2O_3$, $HfO_2$, $WO_3$, $ZrO_2$ and $Ta_2O_5$. The semiconductor materials of the semiconductor structure include, but are not limited to, Ge, SiGe, GaAs, GaN, SiC and $Ga_2O_3$, and the position where the state density function contains at least one peak is near the forbidden band.

FIGS. 3(*a*)-3(*f*) show a flow chart of preparing an array based on germanium (Ge) in the present disclosure.

Each component and specific steps of this embodiment are described in detail below:

101—Substrate, 102—Strip region (bit line) 201—Isolation layer, 202—Resistance variable structure, 301—Metal structure (Word Line), and 302—Contact electrode of bit line.

S1, carrying out pretreatment and cleaning on 101;

S2, forming strip regions 102 arranged at intervals on the structure cleaned in S1 by ion implantation;

S3, growing 201 on the structure obtained in S2 to isolate devices, reduce parasitic capacitance and provide contact for metal layers, and etching 201 to form strip grooves arranged at intervals;

S4, growing 202 on the structure obtained in S3;

S5, growing 301 on the structure obtained in S4, and etching to form strip word lines arranged at intervals;

S6, forming a heavily-doped region at the same end of each strip 102 in the structure obtained in S5, growing 302 in the region, and forming an ohmic contact with the strip 102.

In step S1, 101 in this embodiment is p-type Ge.

In step S2, 102 in this embodiment is n-type Ge.

In S3, 201 in this embodiment is 300 nm $SiO_2$.

In step S4, 202 in this embodiment is a 5 nm unipolar oxide. After Forming, there is a stable conductive CF channel in the device, and forms a Schottky contact with 102.

In step S5, 301 in this embodiment is 100 nm metal.

In step S6, 302 in this embodiment is 100 nm metal, which can form Ohmic contact with the heavily-doped region in 102.

FIGS. 4(*a*)-4(*e*) show a flow chart of preparing an array based on germanium on insulator (GOI) in the present disclosure.

Each component and specific steps of this embodiment are described in detail below:

401—Substrate, 402—Strip region (Bit line), 501—Resistance variable structure, 601—Metal Structure (Word line), and 602—Contact electrode of bit line.

S1: forming strip regions 402 arranged at intervals on 401 by etching;

S2: growing 501 on the structure obtained in S1;

S3: growing 601 on the structure obtained in S2, and etching to form strip word lines arranged at intervals;

S4: forming a heavily-doped region at the same end of each strip 402 in the structure obtained in S5, growing 602 in the region, and forming an ohmic contact with 402.

In step S1, 401 in this embodiment is an insulating layer ($Si/SiO_2$), and 402 is an n-type Ge.

In step S2, 501 in this embodiment is a 5 nm unipolar oxide. There is a stable and conductive CF channel in the unipolar oxide after Forming of the device, and it forms a Schottky contact with 402.

In S3, 601 in this embodiment is 100 nm metal.

In step S5, 602 in this embodiment is 100 nm metal, which can form ohmic contact with the heavily-doped region in 402.

The preparation methods of the metal structure, the resistance variable structure and the semiconductor structure include but are not limited to thermal evaporation, sputtering, atomic layer deposition, chemical vapor deposition, electron beam evaporation, molecular beam epitaxy and pulsed laser deposition.

Figure 5:
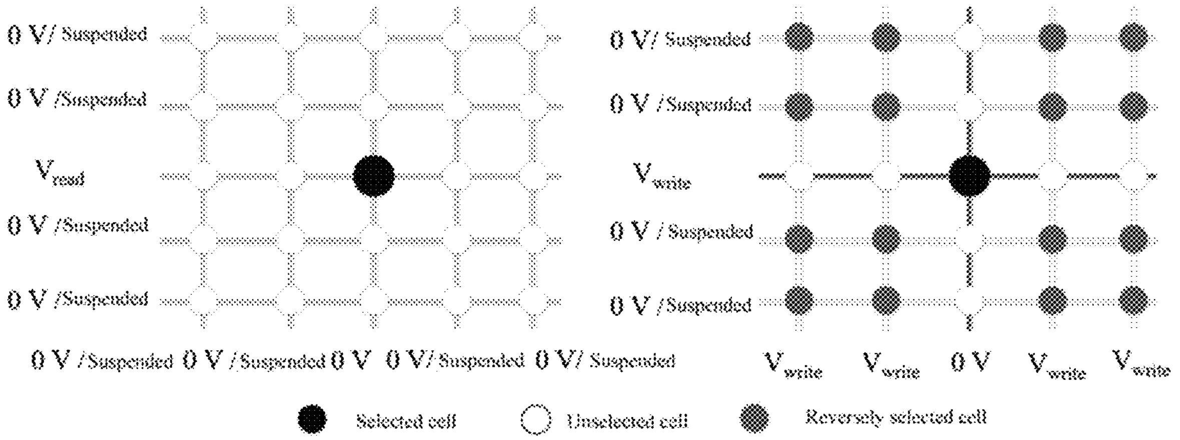
FIG. 5 shows the operation mode of the array according to the present disclosure.

FIG. 5 shows the operation mode of the array in the present disclosure.

Read operation: a read voltage $V_{read}$ is applied to the word line corresponding to the selected device cell, and 0V is applied to the bit line corresponding to the selected device cell. Other ports are connected to 0V or suspended.

Erase operation: an operation voltage $V_{write}$ is applied to the word line corresponding to the device cell, and 0V is applied to the bit line corresponding to the selected device cell. Other word lines are connected to 0V or suspended, and other bit lines are connected to $V_{write}$.

Figure 6:
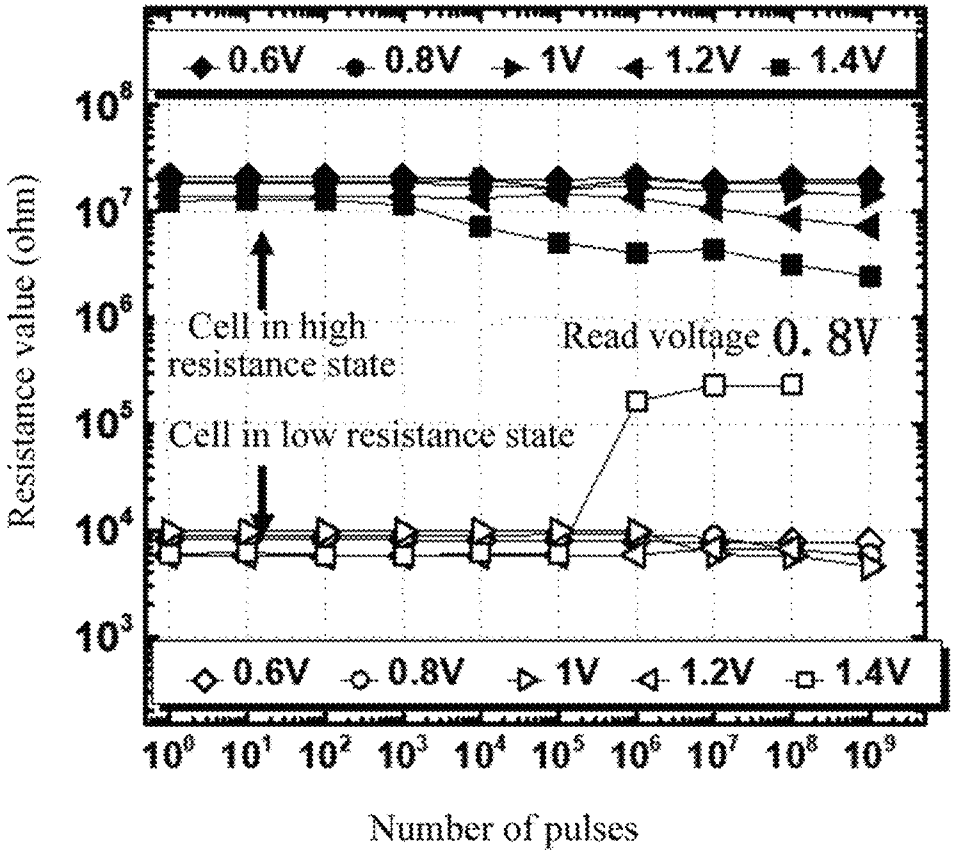
FIG. 6 is a test result of read interference of the array according to the present disclosure.

FIG. 6 is the test result of read interference of the array in the present disclosure.

The device has robust disturbance immunity, which can effectively avoid the interference to other devices in the array when reading the state of the device cell.

Figure 7:
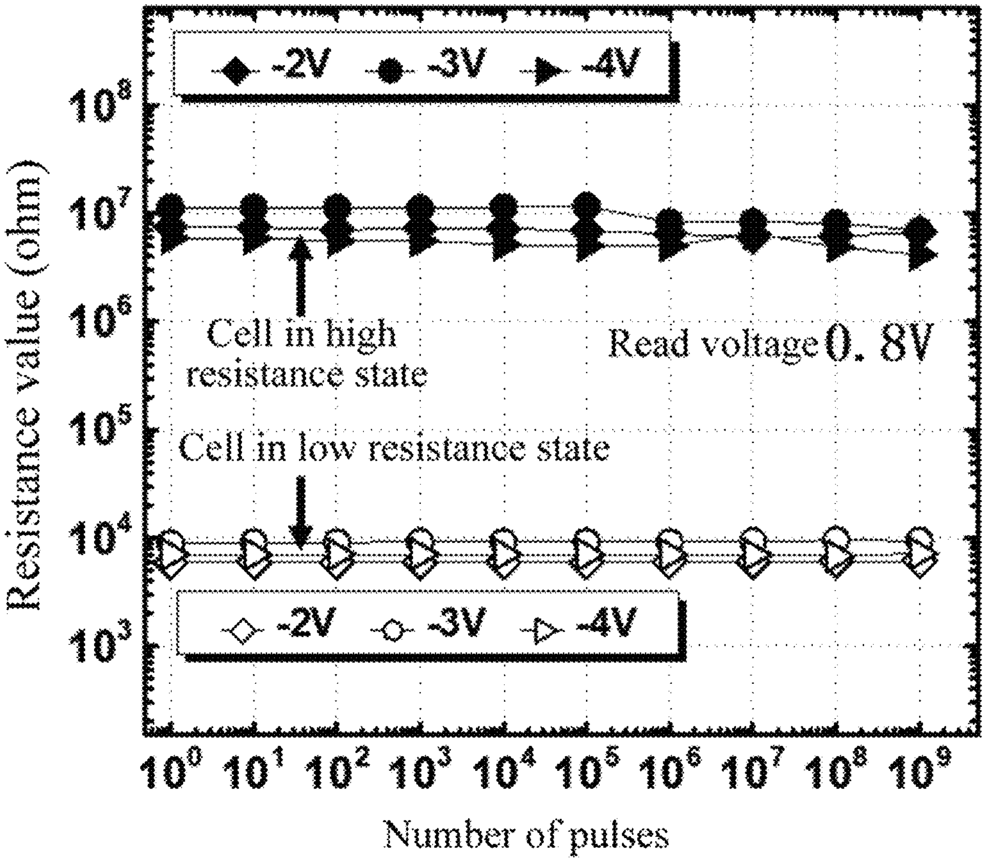
FIG. 7 is an erasure interference test result of the array according to the present disclosure.

FIG. 7 is a test result of erasure interference of the array in the present disclosure.

The erasing operation adopts a V operation voltage solution, and only the reverse voltage exists at both ends of the reversely selected device cells in the array. When the reverse voltage reaches 4 V, the reversely selected device cells still retain good anti-interference ability, which can meet the erasing operation of devices in the array.

Figure 8:
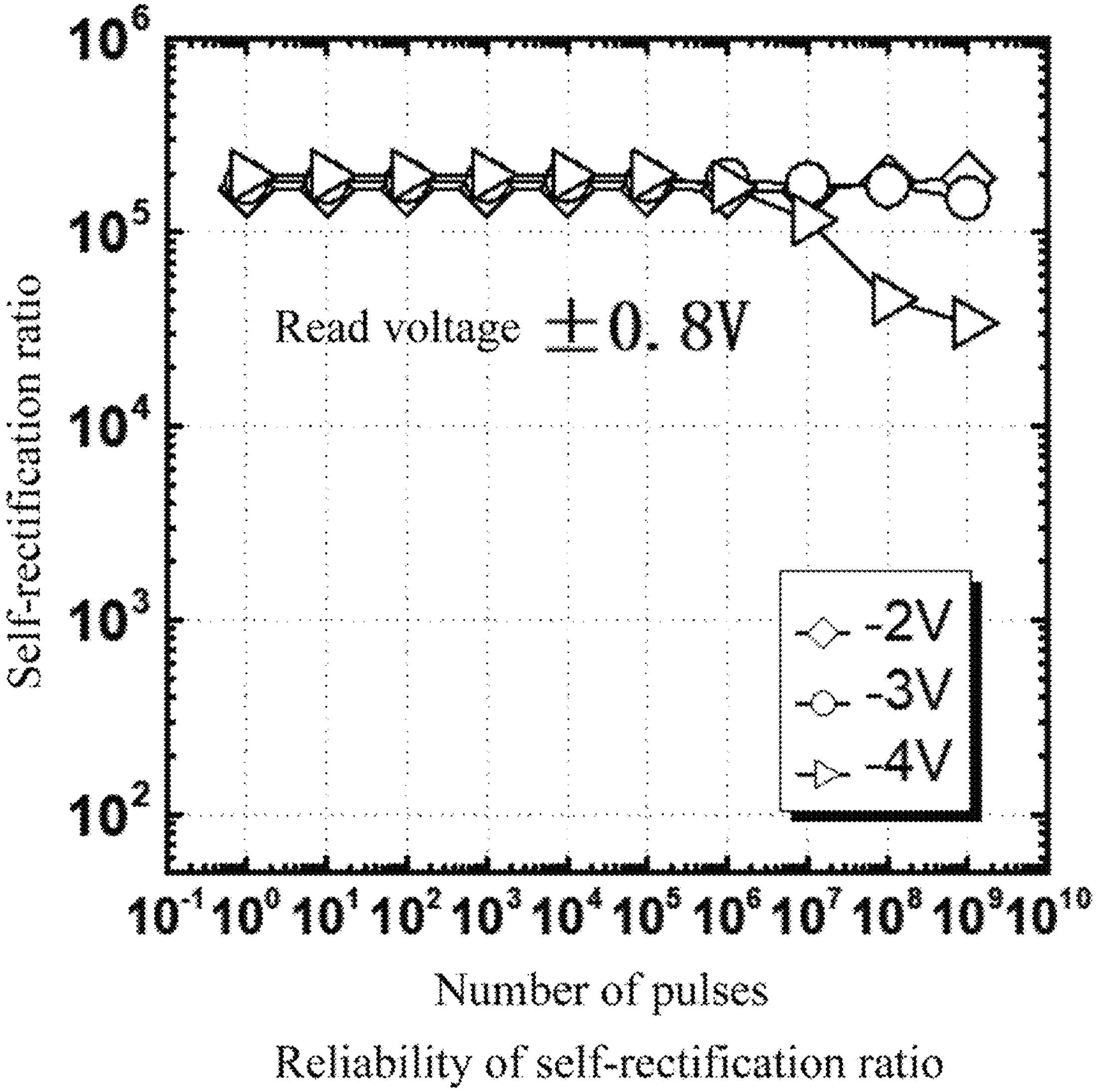
FIG. 8 is a test result of the self-rectification reliability of the array according to the present disclosure.

FIG. 8 is the test result of the self-rectification reliability of the array in the present disclosure.

The erasing operation adopts a V operation voltage solution, and the devices in the array will be subjected to reverse voltage when they are reversely selected, which may degrade the Schottky junction. When the reverse voltage reaches 4 V, the device still retains a stable self-rectification ratio, which ensures the reliability of rectification characteristics during erasing and writing.

Figure 9:
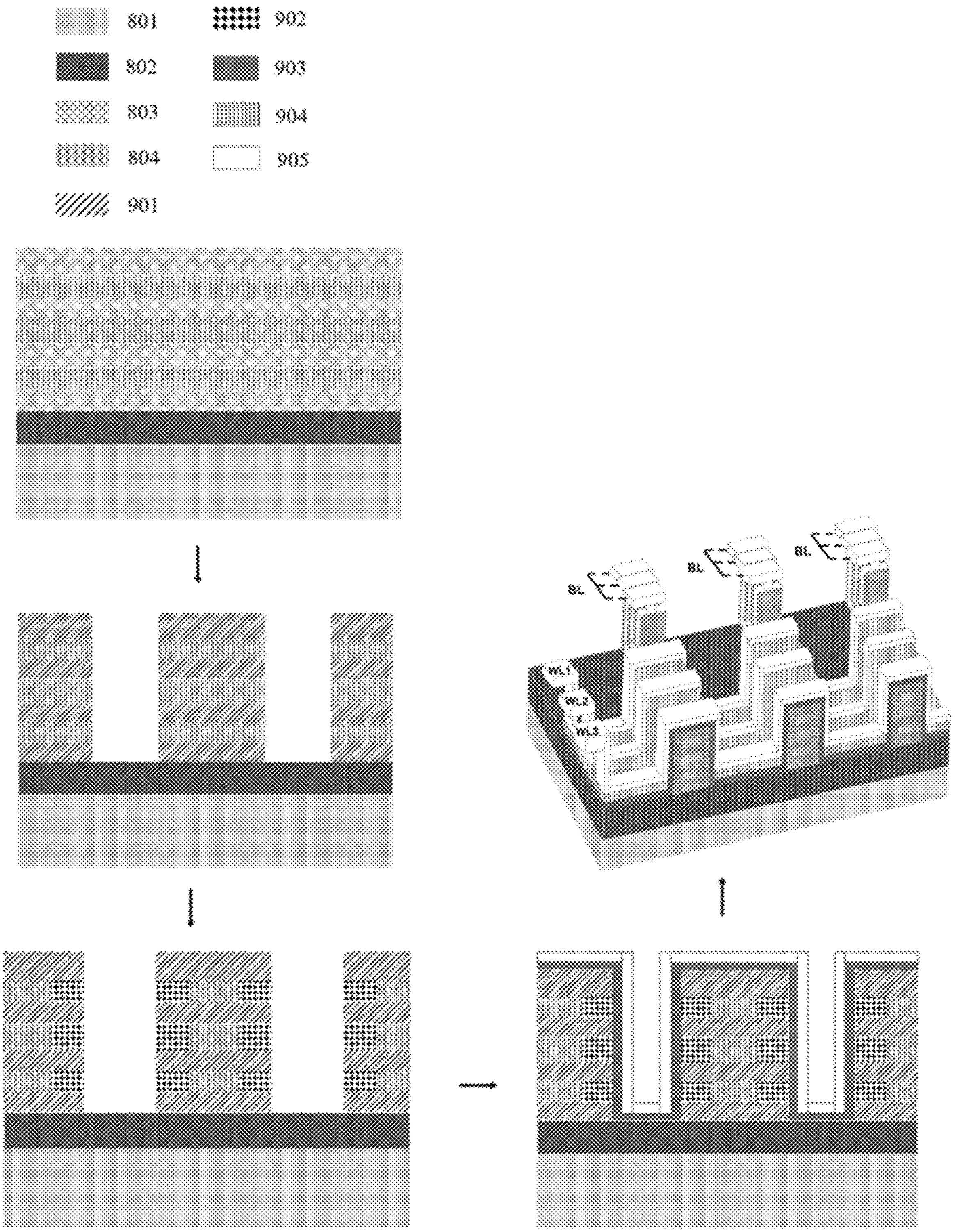
FIG. 9 is a flowchart and a three-dimensional structure diagram of the preparation of a 3D array based on germanium (Ge) according to the present disclosure.

FIG. 9 is a flowchart and a three-dimensional structure diagram of the preparation of a 3D array based on germanium (Ge) in the present disclosure.

Each component and specific steps of this embodiment are described in detail below:

- 801—Substrate, 802—Stress buffer layer of Ge 803—SiGe, 804—Heavily-doped Ge (Bit line), 901—Isolation layer, and 902—Semiconductor structure.
- 903—Resistance variable structure 904—Protective layer of resistance variable structure 905—Metal structure (Word line)
- S1, growing 802 on 801, and then growing 803/804/803/804/803/804/803 in turn;
- S2, selectively etching 803 on the structure obtained in S1 and filling 901;
- S3, selectively etching 804 and filling 902 on the structure obtained in S2;
- S4, growing 903 and 904 on the structure obtained in S3;
- S5, selectively etching 904 in the device region on the structure obtained in S4 904 and growing 905 to form a word line.

In step S1, 801 in this embodiment is a Si substrate, and 802 is a stress buffer layer of Ge (Ge SRB).

In step S2, 901 in this embodiment is silicon dioxide.

In S3, 902 in this embodiment is n-type Ge.

In step S4, 903 in this embodiment is a 5 nm unipolar oxide. After Forming, there is a stable conductive CF channel in the device, and it forms a Schottky contact with 902. The 904 is a SiN protective layer, which can protect the 903 outside the device area.

In step S5, 905 in this embodiment is 100 nm metal.

The preparation methods of the metal structure, the resistance variable structure and the semiconductor structure include but are not limited to thermal evaporation, sputtering, atomic layer deposition, chemical vapor deposition, electron beam evaporation, molecular beam epitaxy and pulsed laser deposition.

The above is only the preferred embodiment of the present disclosure, and although the present disclosure has been disclosed in the above with preferred embodiments, it is not intended to limit the present disclosure. Any person familiar with the field can make many possible changes and modifications to the technical solutions of the present disclosure by using the methods and technical contents disclosed above, or modify it into equivalent embodiments with equivalent changes without departing from the scope of the technical solution of the present disclosure. Therefore, any simple modification, equivalent change and modification made to the above embodiment according to the technical essence of the present disclosure without departing from the content of the technical solution of the present disclosure still fall within the scope of protection of the technical solution of the present disclosure.

What is claimed is:

1. A diode device with programmable conducting current, wherein the device comprises:

- a metal structure,
- a resistance variable structure, with a resistance capable of being adjusted, so as to achieve programmable conducting current, and
- a semiconductor structure comprising a semiconductor, wherein a state density function of the semiconductor comprises at least one peak, such that a state density near an energy level of the at least one peak is greater than a state density of an energy level of the semiconductor structure except the peak,
- wherein the metal structure, the resistance variable structure and the semiconductor structure are directly connected in turn,
- wherein semiconductor material of the semiconductor structure comprises Ge, SiGe, GaAs, GaN, SiC, $Ga_2O_3$, and the state density function comprises at least one peak located near a forbidden band, and
- wherein when semiconductor material of the semiconductor structure is a semiconductor capable of pinning a Fermi level of a metal directly connected to the semiconductor material to vicinity of a valence band of the semiconductor material without being affected by a work function of the metal directly connected to the semiconductor material, a size of a Schottky barrier at a surface of the semiconductor material mainly depends on properties of the semiconductor material.

2. The diode device according to claim 1, wherein the metal structure comprises one or more metals, comprising TiN, Ni, W, Ti, Al, Pd, Pt, Au and Ru; and the resistance variable structure is a unipolar resistance variable oxide layer, and comprises one or more oxides, comprising TiO2, NiO, $Ni_2O_3$, $Y_2O_3$, $HfO_2$, $WO_3$, $ZrO_2$ and $Ta_2O_5$.

3. The diode device according to claim 1, wherein the resistance variable structure is capable of being switched from a low-resistance state to a high-resistance state, or from a high-resistance state to a low-resistance state, in a current conducting direction, by adjusting a voltage and a current limit applied to the metal structure.

4. The diode device according to claim 1, wherein metallic oxygen vacancy conductive filaments locally existing in the resistance variable structure is capable of being directly connected to the semiconductor structure to form a Schottky contact, and the device behaves as a self-rectifying resistive random access memory.

5. A method for preparing a memory array constructed based on the diode device according to claim 1, wherein the method comprises the following forming strip-shaped n-type semiconductors arranged at intervals as bit lines on a p-type semiconductor substrate by ion implantation or spin coating doping, growing an isolation layer, and etching the isolation layer to form grooves arranged at intervals, wherein a range of the grooves is within the bit lines; growing a resistance variable structure on a structure, growing a metal structure on the resistance variable structure, and etching the metal structure to form word lines arranged at intervals; and growing metal at a same end of each of the bit line on the metal structure to form the contact electrodes of the bit lines.

6. A method for preparing a memory array constructed based on the diode device according to claim 1, wherein the method comprises the following: growing an n-type semiconductor on an insulating layer, and etching the n-type semiconductor to form strip regions arranged at intervals as bit lines; growing a resistance variable structure on the bit lines; growing a metal structure on the resistance variable structure and etching the metal structure to form word lines arranged at intervals; and growing metal at a same end of each of the bit lines on the metal structure to form the contact electrodes of the bit lines.

7. A method for preparing a 3D memory array constructed based on the diode device according to claim 1, which adopts Ge as the semiconductor structure, comprising the following growing a stress buffer layer of Ge on a semiconductor silicon substrate, and then cyclically growing SiGe and heavily-doped Ge in turn, wherein a top layer is made of SiGe, bit lines are made of the heavily-doped Ge, and a number of cycles is greater than or equal to 2; selectively etching SiGe on a structure and filling in an isolation layer; selectively etching the heavily-doped Ge and filling lightly-doped Ge on a structure growing a resistance variable structure and a protective layer on a structure; selectively etching the protective layer in an device area on the resistance variable structure, growing a metal structure to form a word line, and growing metal at a same end of each of the bit lines to form the contact electrodes of the bit lines.

8. The method according to claim 5, wherein a bit line region directly connected to the contact electrodes of the bit lines is made of a heavily-doped semiconductor, such that tunneling current dominates to ensure ohmic contact, and wherein the contact electrodes are made of a common metal.

* * * * *